(12) United States Patent
Mathur et al.

(10) Patent No.: US 8,183,107 B2
(45) Date of Patent: May 22, 2012

(54) SEMICONDUCTOR DEVICES WITH IMPROVED LOCAL MATCHING AND END RESISTANCE OF RX BASED RESISTORS

(75) Inventors: Kaveri Mathur, Austin, TX (US); James F. Buller, Austin, TX (US); Andreas Kurz, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 317 days.

(21) Appl. No.: 12/473,074

(22) Filed: May 27, 2009

(65) Prior Publication Data

US 2010/0301423 A1    Dec. 2, 2010

(51) Int. Cl.
H01L 21/8232    (2006.01)

(52) U.S. Cl. . 438/238; 438/382; 438/383; 257/E21.004; 257/E21.616

(58) Field of Classification Search ......... 438/382–384, 438/238; 257/E21.004, E21.616
See application file for complete search history.

(56) References Cited

U.S. PATENT DOCUMENTS

| | | | |
|---|---|---|---|
| 5,411,907 A * | 5/1995 | Yoo et al. | 438/231 |
| 5,888,875 A | 3/1999 | Lasky | |
| 6,104,277 A | 8/2000 | Iniewski et al. | |
| 6,133,094 A * | 10/2000 | Shimamoto et al. | 438/261 |
| 6,180,464 B1 * | 1/2001 | Krivokapic et al. | 438/289 |
| 6,420,221 B1 * | 7/2002 | Lee et al. | 438/199 |
| 6,720,241 B2 * | 4/2004 | Matsumoto et al. | 438/520 |
| 6,897,536 B2 * | 5/2005 | Nomura et al. | 257/403 |
| 7,164,185 B1 | 1/2007 | Salman et al. | |
| 7,939,893 B2 * | 5/2011 | Ema et al. | 257/358 |
| 2003/0022473 A1 * | 1/2003 | Matsumoto et al. | 438/514 |
| 2005/0227440 A1 * | 10/2005 | Ema et al. | 438/275 |
| 2006/0017117 A1 * | 1/2006 | Kotani | 257/379 |
| 2007/0215944 A1 | 9/2007 | Komatsu | |
| 2009/0057759 A1 * | 3/2009 | Obradovic et al. | 257/338 |
| 2011/0111567 A1 * | 5/2011 | Tsutsumi et al. | 438/238 |

OTHER PUBLICATIONS

International Search Report and Written Opinion for corresponding Application No. PCT/US2010/034550, dated Jul. 5, 2010, pp. 1-13.

* cited by examiner

*Primary Examiner* — Evan Pert

(74) *Attorney, Agent, or Firm* — Ditthavong Mori & Steiner, P.C.

(57) ABSTRACT

Semiconductor devices are formed with reduced variability between close proximity resistors, improved end resistances, and reduced random dopant mismatch. Embodiments include ion implanting a dopant, such as B, at a relatively high dosage, e.g. about 4 to about 6 keV, and at a relatively low implant energy, e.g., about 1.5 to about $2E15/cm^2$.

8 Claims, 3 Drawing Sheets

SEMICONDUCTOR DEVICES WITH IMPROVED LOCAL MATCHING AND END RESISTANCE OF RX BASED RESISTORS

TECHNICAL FIELD

The present disclosure relates to miniaturized transistor devices with resistors formed on active regions. The present disclosure is particularly applicable to semiconductor devices formed for the 32 nanometer (nm) technology node and smaller.

BACKGROUND

Typically resistors in integrated circuits are formed in the polysilicon gate electrodes, particularly in various analog applications in 45 nm products. However, as the dimensions of transistor devices continue to shrink, various issues arise imposing increasing demands for methodology enabling the fabrication of semiconductor devices having high reliability and high circuit speed. Smaller transistors require reduced feature sizes. As the gate width for transistors decreases, the reduction in the polysilicon thickness, i.e., below 800 Å, negatively affects the resistance of the resistors.

An attractive alternative to poly resistors is RX based resistors (i.e., resistors formed in the active silicon regions of the silicon substrate), since the active silicon regions are not impacted by the scaling down of the transistor and resulting reduction in polysilicon thickness. In 32 nm technologies and beyond, transistors are typically formed with metal gates and high-K dielectrics, and the polysilicon is replaced with amorphous silicon (a-Si). Resistors formed from the a-Si are impaired because a-Si has an inferior temperature coefficient of electrical resistance (TCR) due to larger grain size. RX resistors have proven to be an attractive alternative, as they have exhibited an improved TCR, with a pre-amorphization implant.

The resistance of resistors is controlled by implanting silicon with boron (B). To implant poly resistors with boron (B) in 45 nm technology, the energy used is typically 8 keV, and the dosage ranges from 2.6E15 to $6.5E15/cm^2$. To use the same energy for targeting RX resistors, a lower B dose as compared with poly/a-Si resistors is required, for example $9E14/cm^2$, to attain the same sheet resistance as the poly resistors. However, the use of a low dose has been found to be problematic.

First, a low B dose decreases the local matching between close proximity resistors. A lower dose means fewer B atoms, which translates into a higher random dopant fluctuation. Since local matching is driven by random dopant fluctuation, the local mismatch coefficient has a linear dependence on B dose. For the target B dose of 9E14, the local mismatch is expected to be about 2.1%-$\mu$m, which is about twice that for poly resistors. A solution for improving local matching is to increase the size of the resistor, thereby reducing random dopant fluctuation. However, increasing resistor size causes an area penalty to the design.

Another problem attendant upon employing a low B dosage is a higher end resistance, because the silicide to silicon contact becomes a Schottky contact instead of ohmic. For a B dose of about 1.1E15, the end resistance is about 60 ohms-$\mu$m, which is significantly higher than the upper specification limit of 45 ohms-$\mu$m. High Rend also impacts the VCR of the resistors. A lower dose, such as the target 9E14, raises the end resistance even further above the specification limit. A proposed solution for improving the end resistance is to increase the implants at the resistor ends. However, that would require an undesirable mask change for existing designs to allow additional implants only in the resistor ends, thereby decreasing manufacturing throughput and increasing cost. It would also adversely affect the sheet resistance of small length resistors.

A need therefore exists for efficient methodology enabling the fabrication of semiconductor devices having RX resistors with increased local matching between close proximity resistors, improved end resistance, and reduced random dopant mismatch.

SUMMARY

An aspect of the present disclosure is a method of fabricating a semiconductor device comprising a resistor with increased local matching between close proximity resistors and improved end resistance.

Another aspect of the present disclosure is a semiconductor device comprising a resistor with increased local matching between close proximity resistors and improved end resistance.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: forming active regions on a substrate; defining resistive structures on portions of the active regions, each resistive structure comprising a first edge and a second edge opposite the first edge; and introducing a dopant into the resistive structures at an energy less than 8 keV and at a dosage greater than or equal to $1.5E15/cm^2$.

Aspects of the present disclosure include ion implanting boron (B) into the resistive structures as at an energy of about 4 to 6 keV and at a dosage of about $1.E15/cm^2$, for example $1.7E15/cm^2$, to $2E15/cm^2$. A further aspect includes forming active regions on a silicon or SOI substrate with a thickness of about 700 to 900 Å. Another aspect includes forming a dielectric layer on the resistive structures, and forming metal contacts through the dielectric layer near the first and second edges of resistive structures. An additional aspect includes forming a silicide block over a center portion of each resistive structure prior to forming the dielectric layer, and forming a silicide on the remainder of the resistive structures. Another aspect includes forming a high-K gate dielectric layer on the substrate between two active regions, and forming a metal gate electrode on the high-K gate dielectric layer. A further aspect includes forming an amorphous silicon layer on the metal gate electrode with a thickness less than 800 Å.

Another aspect of the present disclosure is a semiconductor device comprising: a silicon or SOI substrate; a metal gate electrode, having first and second side surfaces, formed on the substrate; active regions formed in the substrate adjacent the first and second side surfaces of the metal gate electrode, portions of the active regions being resistive structures each with a first edge and a second edge opposite the first edge, the resistive structures having been ion implanted with a dopant at a dosage greater than $1.5E15/cm^2$, e.g., greater than $7E15/cm^2$, and an energy of about 4 to 6 keV.

Aspects include resistive structures having been ion implanted with B at a dosage of about $1.5E15/cm^2$ to $2E15/cm^2$, e.g. $1.7E15/cm^2$ to $2E15/cm^2$. Another aspect includes metal contacts near each first edge and each second edge. An additional aspect includes a high-K gate dielectric under the gate electrode. A further aspect includes an amorphous silicon layer on the metal gate electrode with a thickness less than 800 Å. Another aspect includes a silicide block over a center portion of each resistive structure, and a silicide layer on the remainder of each resistive structure.

Another aspect of the present disclosure is a method of fabricating a semiconductor device, the method comprising: forming a high-K gate dielectric layer on a silicon or SOI substrate; forming a metal gate electrode, having first and second side surfaces, on the high-K gate dielectric layer; forming active regions in the substrate adjacent the first and second side surfaces of the metal gate electrode; defining resistive structures on portions of the active regions, each resistive structure comprising a first edge and a second edge opposite the first edge; introducing a B dopant into the resistive structures at an energy of about 4 to 6 keV and a dosage of about $1.5E15/cm^2$ to $2E15/cm^2$, e.g. $1.7E15/cm^2$ to $2E15/cm^2$; forming a dielectric layer on the resistive elements; and forming metal contacts through the dielectric layer near the first and second edges of resistive structures. A further aspect includes forming an amorphous silicon layer on the metal gate electrode with a thickness less than 800 Å. Another aspect includes forming a silicide block over a center portion of each resistive structures prior to forming the dielectric layer, and forming a silicide on the remainder of the resistive structures.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
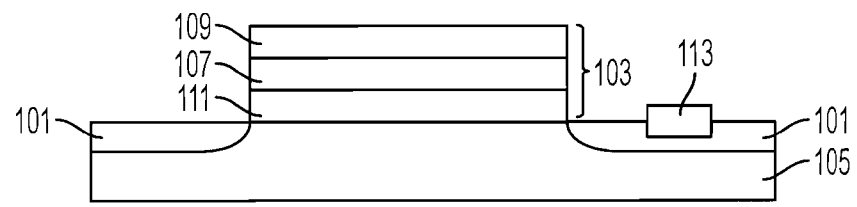
FIG. 1 schematically illustrates a semiconductor with resistor formed on an active silicon region, according to an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

Conventional practices include forming active regions on a silicon substrate, defining resistive structures on portions of the active regions, each resistive structure comprising a first edge and a second edge opposite the first edge, and introducing a dopant into the resistive structures at an implant energy of 8 keV and a dosage of about $9E14/cm^2$. However, such implantation conditions are problematic, i.e., poor local matching between resistors, high end resistance for the resistors, and high random dopant fluctuation result.

The present disclosure addresses and solves the problems of local mismatch between resistors, excessive end resistance for the resistors, and random dopant mismatch, when two resistors are formed in close proximity to each other, e.g., at a distance of about 1-10 um range, in active regions of a silicon substrate. In accordance with embodiments of the present disclosure, a resistor structure is formed by doping the silicon at a relatively high dopant dosage using a relatively low implant energy. It was found that by employing a relatively high dopant dosage, the number of dopant atoms increases, thereby reducing random dopant fluctuation, and increasing local matching between close proximity resistors. It was also found that employing a relatively low implant energy compensates for the higher dosage by maintaining the sheet resistance at the desired value, while the increased dosage improves the end resistance.

Embodiments of the present disclosure include ion implanting a dopant at an implant energy below 8 keV, e.g., between about 4 keV and about 6 keV, and at a dosage of at least $1.5E15/cm^2$, e.g., between about $1.5E15/cm^2$ and about $2E15/cm^2$, for example between about $1.7E15/cm^2$ and about $2E15/cm^2$ Embodiments further include introducing B as the dopant. Further embodiments include forming the active regions on a silicon or SOI substrate, as at a thickness of about 700 to about 900 Å. Embodiments also include forming a silicide block over a center portion of each resistive structure and forming a silicide on the remainder of the resistive structures. Subsequently, a dielectric layer is formed on the resistive structures, and metal contacts are formed through the dielectric layer near the first and second edges of resistive structures. Methodology typically includes forming a high-K gate dielectric layer on the substrate between two active regions, and forming a metal gate electrode on the high-K gate dielectric layer. Methodology also includes forming an amorphous silicon layer on the metal gate electrode with a thickness less than 800 Å.

A typical semiconductor device comprises a silicon or SOI substrate, a metal gate electrode formed on the substrate, active regions formed in the substrate adjacent first and second side surfaces of the metal gate electrode, portions of the active regions being resistive structures, each with a first edge and a second edge opposite the first edge. The resistive structures typically include a dopant, such as B, ion implanted into the resistive structures at an implant energy of 8 keV and a dopant dosage around $9E14/cm^2$. It was found, however, that such implantation conditions increase local mismatch between resistors and increase end resistance. In accordance with embodiments of the present disclosure, semiconductor devices comprising resistors in silicon, in close proximity to each other, e.g., at a distance of about 1-10 um range, are fabricated with significantly reduced mismatching and end resistances by ion implanting a dopant, e.g., B, at a relatively high dosage, e.g., greater than $1.5E15/cm^2$, such as about 1.5 to $2E15/cm^2$, for example about 1.7E15 to $2E15/cm^2$, and at by a relatively low energy, such as below 8 keV, e.g., about 4 to 6 keV. The resistive structures typically include metal contacts near each first edge and each second edge. The metal gate electrode typically overlies a high-K gate dielectric, and an amorphous silicon layer overlies the metal gate electrode with a thickness less than 800 Å. The resistive structure may include a silicide block over a center portion of each resistive structure, and a silicide layer on the remainder of each resistive structure.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

A semiconductor with resistors formed in active silicon regions, in accordance with an embodiment of the present disclosure is schematically illustrated in FIG. 1. Active silicon regions 101 are formed adjacent opposite side surfaces of gate 103 on substrate 105. The substrate may be a silicon wafer or a silicon-on-insulator (SOI) substrate, and may have a thickness about 700 to 900 Å. Gate structure 103 is shown as a metal electrode 107 with a polysilicon or a-Si layer 109, on a high-K dielectric layer 111. Polysilicon or a-Si layer 109 has a thickness less than 800 Å. Resistor structure (RX) 113 is formed in active region 101.

Figure 2:
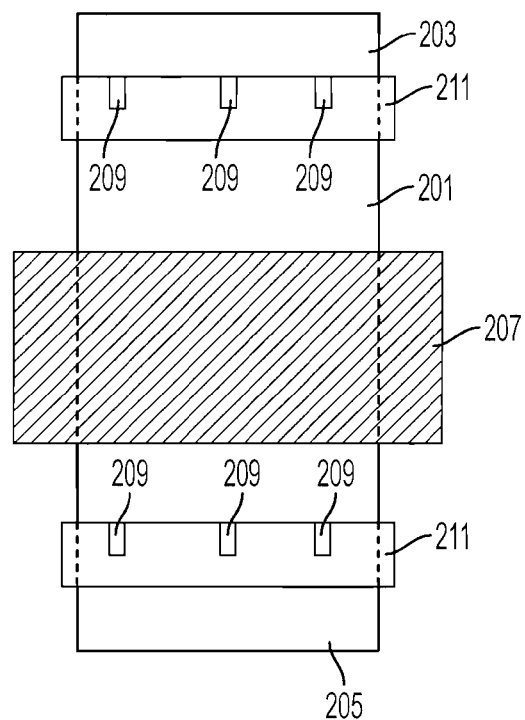
FIG. 2 schematically illustrates in plan view a resistor formed on an active silicon region, according to an exemplary embodiment.
Figure 3:
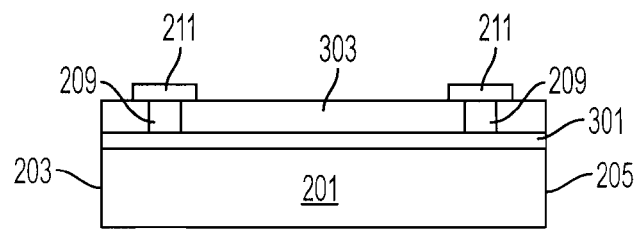
FIG. 3 schematically illustrates a side view of the resistor of FIG. 2, according to an exemplary embodiment.

As illustrated in FIGS. 2 and 3, RX 113 includes a portion 201 of active silicon region 101 having a first edge 203 and a second edge 205. Portion 201 includes a dopant, for example B. The introduction of B into silicon region 201 is described in more detail below in reference to FIGS. 4 and 5. A silicide layer 301 is formed by covering the silicon 201 with a refractory metal, such as nickel, (not shown for illustrative convenience) and heating to react the metal with the silicon to form silicide layer 301. During formation of the resistor, silicide block 207, e.g., photo resist or nitride, should be used to prevent silicidation at the body of the resistor. A dielectric layer 303 is formed over silicide layer 301. Holes are formed near edges 203 and 205 through dielectric layer 303 and filled with a conductive material to form contacts 209, which connect to metal straps 211, formed from the semiconductor's metal 1 pattern.

Figure 4:
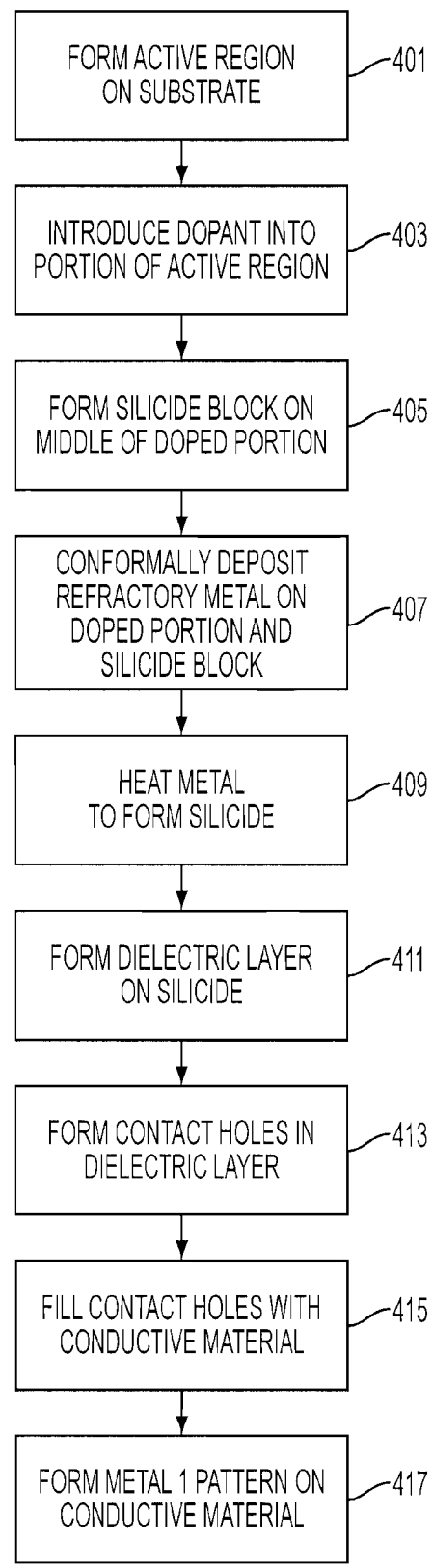
FIG. 4 is a flowchart of the process for fabricating a semiconductor device with a resistor, according to an exemplary embodiment.

A method of forming RX 113 is described in FIG. 4. In step 401, an active region, for example a transistor source or drain, is formed in a silicon or SOI substrate. Where the resistor is to be formed, a dopant such as B is introduced into the silicon, as by ion implantation, at step 403. The B dopant is introduced with an energy less than 8 keV, e.g., about 4 to about 6 keV, and a dose greater than $1.5E15/cm^2$, e.g., about 1.5E15 to about $2E15/cm^2$, for example $1.7E15/cm^2$ to about $2E15/cm^2$.

A silicide block should be formed over the center region of the doped silicon at step 405. In step 407, a refractory metal such as, for example, cobalt, nickel, or titanium, is conformally deposited over the doped silicon and silicide block. The metal reacts with the underlying silicon, when heated in step 409, to form a metal silicide. The silicide block prevents metal from being deposited at the center region of the doped silicon, thereby preventing a silicide from forming in that region.

A layer of dielectric material, e.g., a silicon oxide, having a thickness ranging from about 1500 Å to about 2500 Å is formed on the silicide in step 411. At step 413, openings are formed in the dielectric layer at each end of the resistor structure, as by etching. The holes expose terminal portions of the silicide layer. An electrically conductive material, such as tungsten or titanium tungsten, is deposited on the dielectric layer and in the holes in step 415, followed by planarization, as by a chemical mechanical polishing (CMP) having a high selectivity to the dielectric layer. The filled holes act as contacts for the resistor. In step 417, a metal 1 pattern is formed over the dielectric layer forming metal straps over the contacts.

Figure 5:
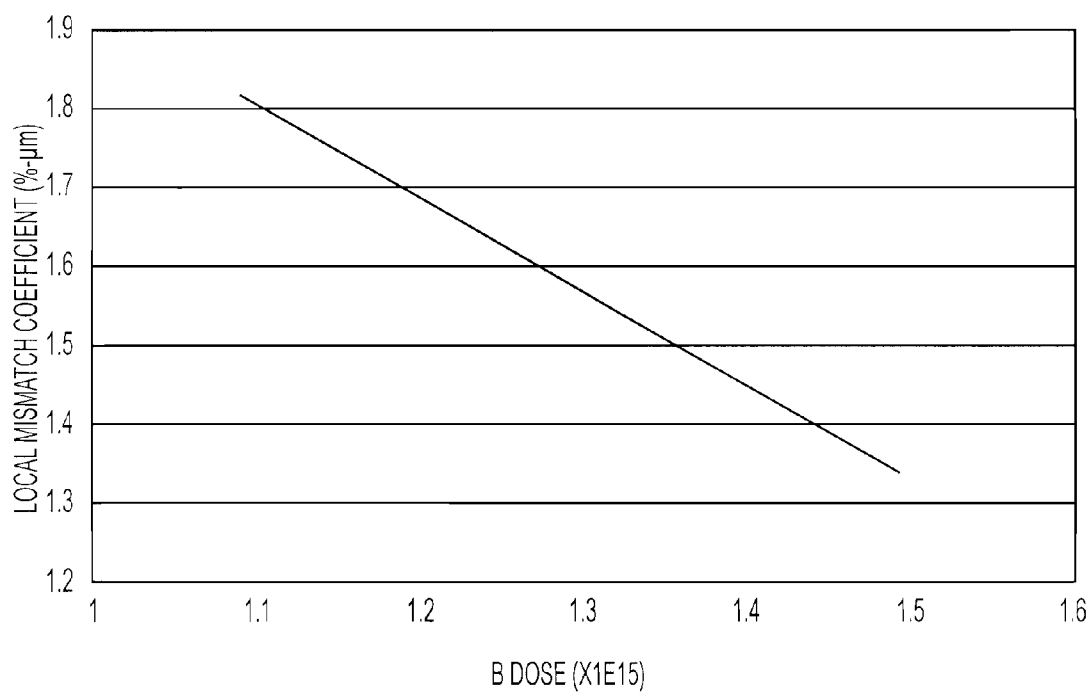
FIG. 5 graphically illustrates the relationship between the local mismatch coefficient and the dosage of boron.

FIG. 5 shows the linear relationship between the B dose and the local mismatch coefficient. As illustrated, the local mismatch coefficient increases as the dosage decreases from 1.5E15 to 1.1E15. Given the linear relationship, the local mismatch coefficient would be expected to continue increasing to about 2.1%-μm if the B dose were to be reduced to 9E14, as used for poly resistors (poly resistors typically use higher doses as mentioned on page 1, which is why local mismatch is worse for RX resistors as compared to poly resistors). On the other hand, the local mismatch coefficient continues to decrease linearly with an increase in dose until saturation is reached. Accordingly, by reducing the implant energy while increasing the B dose to greater than about 1.5E15, such as about 1.5E15 to about 2E15, for example about 1.7E15 to about 2E15, the local mismatch coefficient can be improved.

The embodiments of the present disclosure achieve several technical effects, including reduced local mismatch between close proximity resistors and improved end resistance without increasing the area of each resistor or requiring additional masking steps. The present disclosure enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a high-K gate dielectric layer on a substrate;
    forming a metal gate electrode on the high-K gate dielectric layer;
    forming an amorphous silicon layer on the metal gate electrode with a thickness less than 800 Å;
    forming source/drain regions in the substrate adjacent opposite sides of the high-K dielectric layer, metal gate electrode, and amorphous silicon layer;
    defining resistive structures in portions of the source/drain regions, each resistive structure comprising a first edge and a second edge opposite the first edge; and
    introducing a dopant into the resistive structures by introducing a dopant into the portions of the source/drain regions in the substrate at an energy less than 8 keV and at a dosage greater than or equal to $1.5E15/cm^2$.

2. The method according to claim 1, comprising ion implanting boron (B) as the dopant into the resistive structures.

3. The method according to claim 2, comprising ion implanting B at an energy of about 4 to 6 keV and at a dosage of about 1.5 to $2E15/cm^2$.

4. The method according to claim 3, comprising forming source/drain regions in a silicon or SOI substrate.

5. The method according to claim 4, wherein the substrate thickness is about 700 Å to about 900 Å.

6. The method according to claim 3, further comprising:
forming a dielectric layer on the resistive structures; and
forming metal contacts through the dielectric layer proximate the first and second edges of resistive structures.

7. The method according to claim 6, further comprising:
forming a silicide block over a center portion of each resistive structure prior to forming the dielectric layer; and
forming a silicide layer on the remainder of the resistive structures.

8. A method of fabricating a semiconductor device, the method comprising:
forming a high-K gate dielectric layer on a silicon or SOI substrate;
forming a metal gate electrode, having first and second side surfaces, on the high-K gate dielectric layer;
forming an amorphous silicon layer on the metal gate electrode with a thickness less than 800 Å;
forming active regions in the substrate adjacent the first and second side surfaces of the metal gate electrode;
defining resistive structures on portions of the active regions, each resistive structure comprising a first edge and a second edge opposite the first edge;
introducing a B dopant into the resistive structures at an energy of about 4 to 6 keV and at a dosage of about 1.5 to $2E15/cm^2$;
forming a silicide block over a center portion of each resistive structure;
forming a silicide on the remainder of the resistive structures;
forming a dielectric layer on the resistive structures; and
forming metal contacts through the dielectric layer near the first and second edges of resistive structures.

* * * * *